United States Patent [19]

Takahashi et al.

[11] Patent Number: 5,818,275
[45] Date of Patent: Oct. 6, 1998

[54] CLOCK SIGNAL GENERATING CIRCUIT

[75] Inventors: Hiroshi Takahashi, Ohi-machi; Shigeshi Abiko, Tokyo, both of Japan

[73] Assignee: Texas Instruments Incorporated, Dallas, Tex.

[21] Appl. No.: 905,194

[22] Filed: Aug. 1, 1997

Related U.S. Application Data

[63] Continuation of Ser. No. 391,992, Feb. 21, 1995, abandoned.

[30] Foreign Application Priority Data

Feb. 21, 1994 [JP] Japan .................................. 6-022773

[51] Int. Cl.⁶ ..................................................... H03K 5/15
[52] U.S. Cl. ........................................... 327/259; 327/239
[58] Field of Search ..................................... 327/525, 239, 327/252, 253, 258, 259, 291–293, 295, 296

[56] References Cited

U.S. PATENT DOCUMENTS

| | | | |
|---|---|---|---|
| 4,283,639 | 8/1981 | Roesler .................................... | 327/295 |
| 4,417,158 | 11/1983 | Ito et al. .................................. | 327/295 |
| 4,645,947 | 2/1987 | Prak ........................................ | 327/239 |
| 4,827,157 | 5/1989 | Machida et al. ........................ | 327/295 |
| 4,894,791 | 1/1990 | Jiang et al. .............................. | 327/276 |
| 4,905,192 | 2/1990 | Nogami et al. ......................... | 365/200 |
| 5,041,738 | 8/1991 | Walters, Jr. ............................. | 327/295 |
| 5,440,250 | 8/1995 | Albert ..................................... | 327/296 |
| 5,453,707 | 9/1995 | Hiratsuka et al. ...................... | 327/259 |
| 5,517,455 | 5/1996 | McClure et al. ........................ | 327/525 |

FOREIGN PATENT DOCUMENTS

| | | | |
|---|---|---|---|
| 59-149417 | 8/1984 | Japan ..................................... | 327/295 |
| 59-161913 | 9/1984 | Japan ..................................... | 327/291 |
| 168016 | 3/1989 | Japan ..................................... | 327/291 |
| 1320816 | 12/1989 | Japan ..................................... | 327/283 |
| 3102911 | 4/1991 | Japan ..................................... | 327/291 |
| 48012 | 1/1992 | Japan ..................................... | 327/295 |

Primary Examiner—Timothy P. Callahan
Assistant Examiner—T. T. Lam
Attorney, Agent, or Firm—Gerald E. Laws; William B. Kempler; Richard L. Donaldson

[57] ABSTRACT

Clock signal generating circuit for preventing occurrence of clock skew, totally preventing through current, and readily controlling the clock, which includes a master clock signal generating circuit 2M and a slave clock signal generating circuit 2S. The master clock signal generating circuit 2M generates a master clock signal MCLK at a high level based on a slave clock signal SCLK at a low level and a clock signal CLK at a low level, and generates a master clock signal MCLK at a low level based on the clock signal CLK at a high level. The slave clock signal generating circuit 2S generates a slave clock signal SCLK at a low level based on the clock signal CLK at a low level and a slave clock signal SCLK at a high level based on the master clock signal MCLK being at a low level and the clock signal CLK at a high level. A master clock delay generating circuit 3M inputs the slave clock signal SCLK as output from the slave clock signal generating circuit 2S to be able to set the delay time optionally in the master clock signal generating circuit 2M by delaying for the necessary time. Additionally, a slave clock delay generating circuit 3S is provided which inputs the master clock signal MCLK output from the master clock signal generating circuit 2M to be able to set the delay time optionally into the slave clock signal generating circuit 2S by delaying for the necessary time.

6 Claims, 4 Drawing Sheets

CLOCK SIGNAL GENERATING CIRCUIT

This application is a Continuation of application Ser. No. 08/391,992, filed Feb. 21, 1995, now abandoned.

The present invention relates to a clock signal generating circuit which generates two mutually complementary clock signals by setting an isolation time so that they do not become active at the same time.

BACKGROUND OF THE INVENTION

In a device such as a CPU (central processing unit), prescribed processing is executed based on the basic clock signals emitted from a quartz oscillator, PLL (phase-locked loop circuit), etc.

Figure 4:
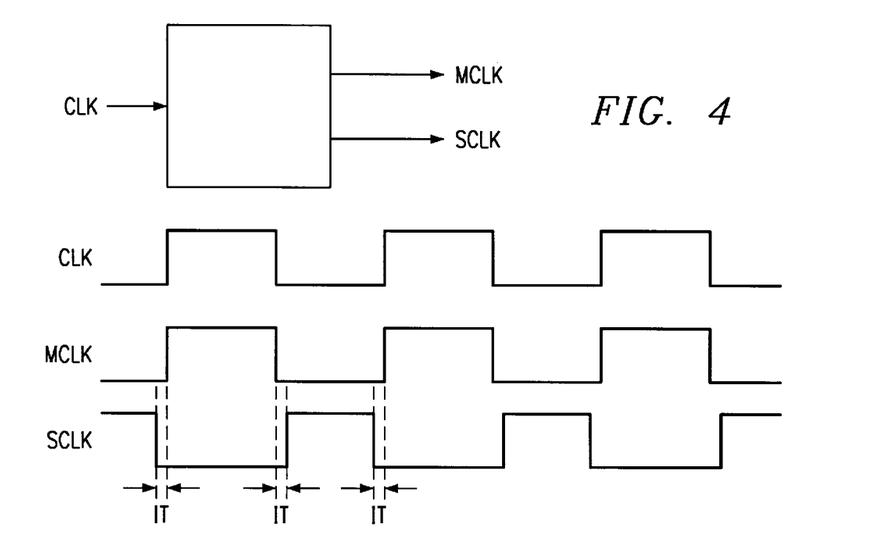
FIG. 4 is a diagrammatic illustration of respective clock signal waveforms for explaining the isolation time with respect to the master clock signal, the slave clock signal, and both signals.

In high speed devices such as a DSP (digital signal processor), usually, a clock generating circuit is provided which generates a master clock signal MCLK and a slave clock signal SCLK which take on mutually complementary high and low levels in which the phase is shifted by 180° C. from an input basic clock signal CLK, as shown in FIG. 4, and prescribed processing is executed based on the master clock signal MCLK and slave clock signal SCLK. When the wiring length of the clock signals becomes long, the leading edge and the trailing edge characteristics of the clock signals deteriorate in accordance with the increase in the impedance components of the wiring itself so the possibility for clock skew in which master clock signal MCLK and slave clock signal SCLK both take on high levels at the end part of the wiring becomes high. The possibility for clock skew generation increases also in accordance with the increase in the capacitance of the load driven by the clock signals.

In this case, the isolation time IT at which time both of the clock signals take on low levels is provided to master clock signal MCLK and slave clock signal SCLK as shown in FIG. 4 in order to prevent so-called clock skew.

It is preferable for the isolation time IT to be as short as possible and in high speed devices, such as a DSP in particular, there is a strong desire to make the isolation time very short, make the high level time of the clock long, and use this time for the actual operation.

Therefore, even in device simulation, evaluation of the critical value of the isolation time in the actual device is executed using a tool such as SPICE.

However, even when a tool such as SPICE is used as in the conventional technology, the reality is that correct simulation cannot always be executed due to the error rate of the SPICE model and difficulty in correct calculation of the wiring.

Also, control of the terminals in all clocks has become very difficult with the introduction of an automatic wiring tool.

Furthermore, there has been a problem in the conventional clock signal generating circuit of noise being generated by the spike current and the power consumption increasing due to the through current.

Also, when clock skew subsequently occurred, it was difficult to reset the isolation time to be longer in the conventional technology and it was necessary to redo the design of the semiconductor device in order to execute a resetting operation so there was a problem of the developmental time of the semiconductor device increasing. When the isolation time is set on the long side beforehand in order to make the development time short, it meant that isolation time which was more than necessary would be provided; thus there was a problem of the performance of the semiconductor device decreasing.

It is an object of the present invention to provide a clock signal generating circuit which can control the clock easily, can provide current flowing in the transistors connected in series, and can prevent clock skew occurring subsequently and the critical value can be easily evaluated.

SUMMARY OF THE INVENTION

In accordance with the invention, a clock signal generating circuit having first and second clock signal generating circuits is provided, wherein the first clock signal generating circuit generates a first clock signal of the first level based on the basic clock signal of the first level, and a first clock signal of the second level based on the basic clock signal of the second level and a second clock signal of the first level, and the second clock signal generating circuit generates a second clock signal of the second level based on the basic clock signal of the first level and a first clock signal of the first level, and a second clock signal of the first level based on the basic clock signal of the second level.

Also, the clock signal generating circuit of the present invention has a first clock signal delay circuit which delays the first clock signal output from the first clock signal generating circuit for a prescribed time and inputs it into the second clock signal generating circuit, and a second clock signal delay circuit which delays the second clock signal output from the second clock signal generating circuit for a prescribed time and inputs it into the first clock signal generating circuit.

Also, in the clock signal generating circuit of the present invention, the first clock signal delay circuit and the second clock signal delay circuit include plural delay paths with different delay times and plural switching means provided to each delay path, and the delay time of the first clock signal and the second clock signal is set by selectively controlling the opening and closing of each delay path with each switching means.

Also, the clock signal generating circuit of the present invention has a clock delay selecting circuit which outputs plural control signals corresponding to the cutoff or non-cutoff of the fuse and the opening and closing of each switching means is controlled by the control signals.

According to the clock signal generating circuit of the present invention, a basic clock signal of the first level, for example, the low level is input into the first clock signal generating circuit and the second clock signal generating circuit.

In the first clock signal generating circuit with a low level basic clock signal input, a first clock signal at the low level (first level) is generated and then output, based on the first basic clock signal. Also, the low level first clock signal is output to the second clock signal generating circuit.

At this time, a low level basic clock signal is input into the second clock signal generating circuit, but the generation of a second clock signal of a second level (for example, a high level) is not executed until the first clock signal at the low level (first level) is input.

Then, the second clock signal at the high level is generated and output in accordance with the input of the first clock signal at the low level generated in the first clock signal generating circuit.

Therefore, the second clock signal is maintained at the same level as the first clock signal at the low level during the time from when the basic clock signal is input until the first clock signal is input. Specifically, this means that an isolation time has been given to the first and second clock signals.

Here, when the basic clock signal is switched from the first level (low level) to the second level (high level) and input into the first clock signal generating circuit and the second clock signal generating circuit, the second clock signal at the low level (first level) is generated and output based on the input of the basic clock signal in the second clock signal generating circuit to which the basic clock signal at the high level was input. Also, the second clock signal at the low level is output to the first clock signal generating circuit.

At this time, the basic clock signal at the high level is input in the first clock signal generating circuit but generating a first clock signal at the second level, namely, the high level is not executed until a second clock signal at the low level (first level) is input.

Then, a first clock signal at the high level is generated in accordance with the second clock signal at the low level generated in the second clock signal generating circuit having been input.

Therefore, the first clock signal is maintained at the same level as the second clock signal at the low level during the time from when the basic clock signal is input until the second clock signal is input.

Also, according to the clock signal generating circuit of the present invention, the first clock signal output from the first clock signal generating circuit is input into the second clock signal generating circuit after being delayed for a prescribed time in the first clock signal delay circuit.

Similarly, the second clock signal output from the second clock signal generating circuit is input into the first clock signal generating circuit after being delayed for a prescribed time in the second clock signal delay circuit.

In this way, a second clock signal at the second level is generated based on the basic clock signal at the first level and a first clock signal of the first level which passed through the first clock signal delay circuit.

Similarly, a first clock signal at the second level is generated based on the basic clock signal at the second level and a second clock signal at the first level which passed through the second clock signal delay circuit.

Thereby, the isolation time is maintained at the preset time and clock skew is prevented.

Also, the opening and closing of each switching means provided to plural delay paths with different delay times in the first clock signal delay circuit and the second clock signal delay circuit are controlled selectively according to, for example, the cutoff or non-cutoff of the fuse in order to set the delay time at the prescribed time.

Thereby, the isolation time can be set to the necessary time and clock skew can easily be prevented from occurring subsequently.

Reference Numerals and Symbols as Shown in the Drawings:

$T_{clk}$ . . . clock signal input terminal, $T_{CTL}$ . . . control signal input terminal, 1M . . . master clock level selecting circuit, 1S . . . slave clock level selecting circuit, 2M . . . master clock signal generating circuit, 2S . . . slave clock signal generating circuit, 3M . . . master clock delay generating circuit, 3S . . . slave clock delay generating circuit, 4 . . . clock delay selecting circuit, $INV_1$–$INV_6$ . . . .inverters.

DESCRIPTION OF PREFERRED EMBODIMENT

Figure 1A:
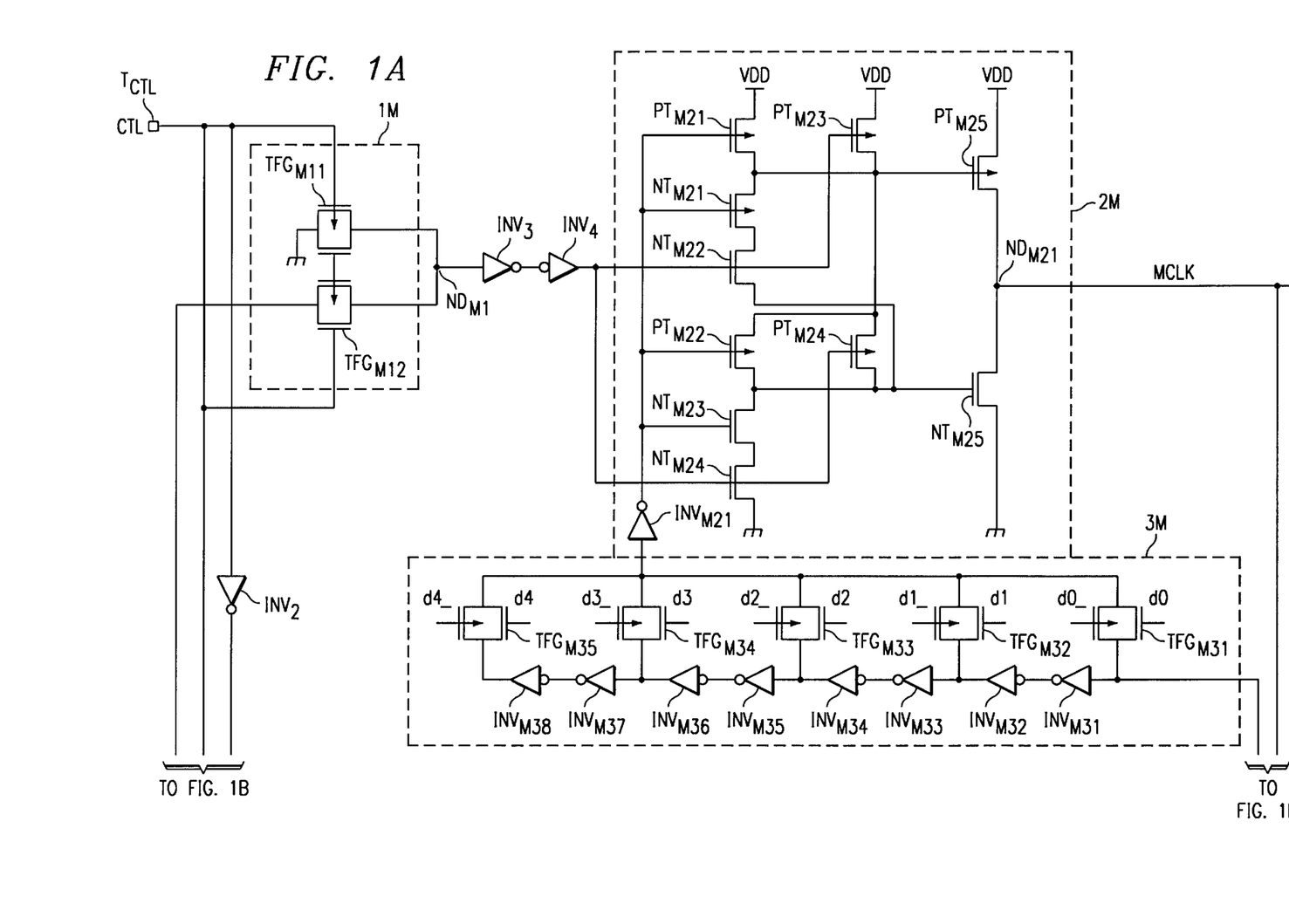
FIG. 1 is a schematic circuit diagram showing one embodiment of a clock signal generating circuit in accordance with the invention.
Figure 1B:
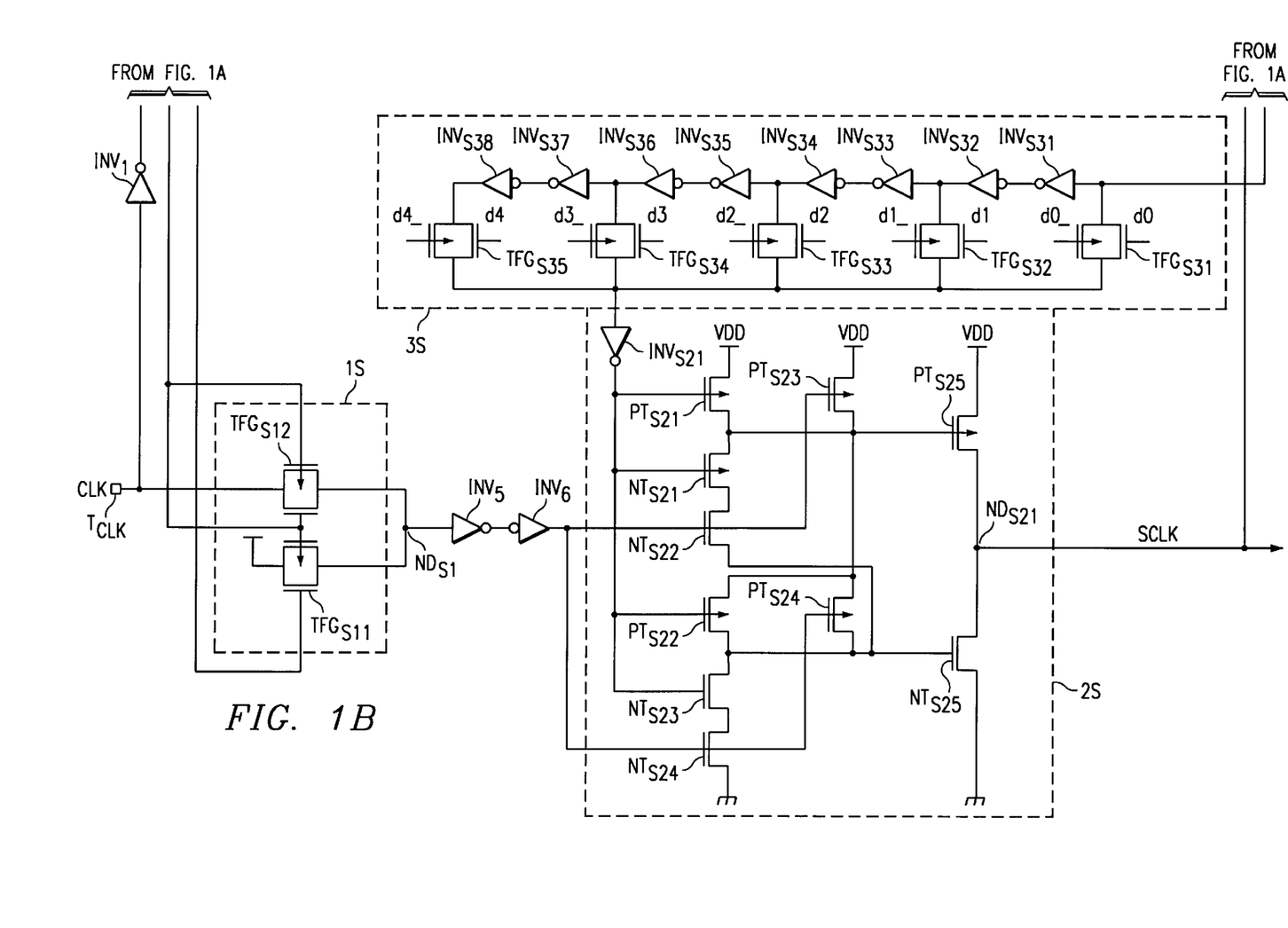
Figure 2:
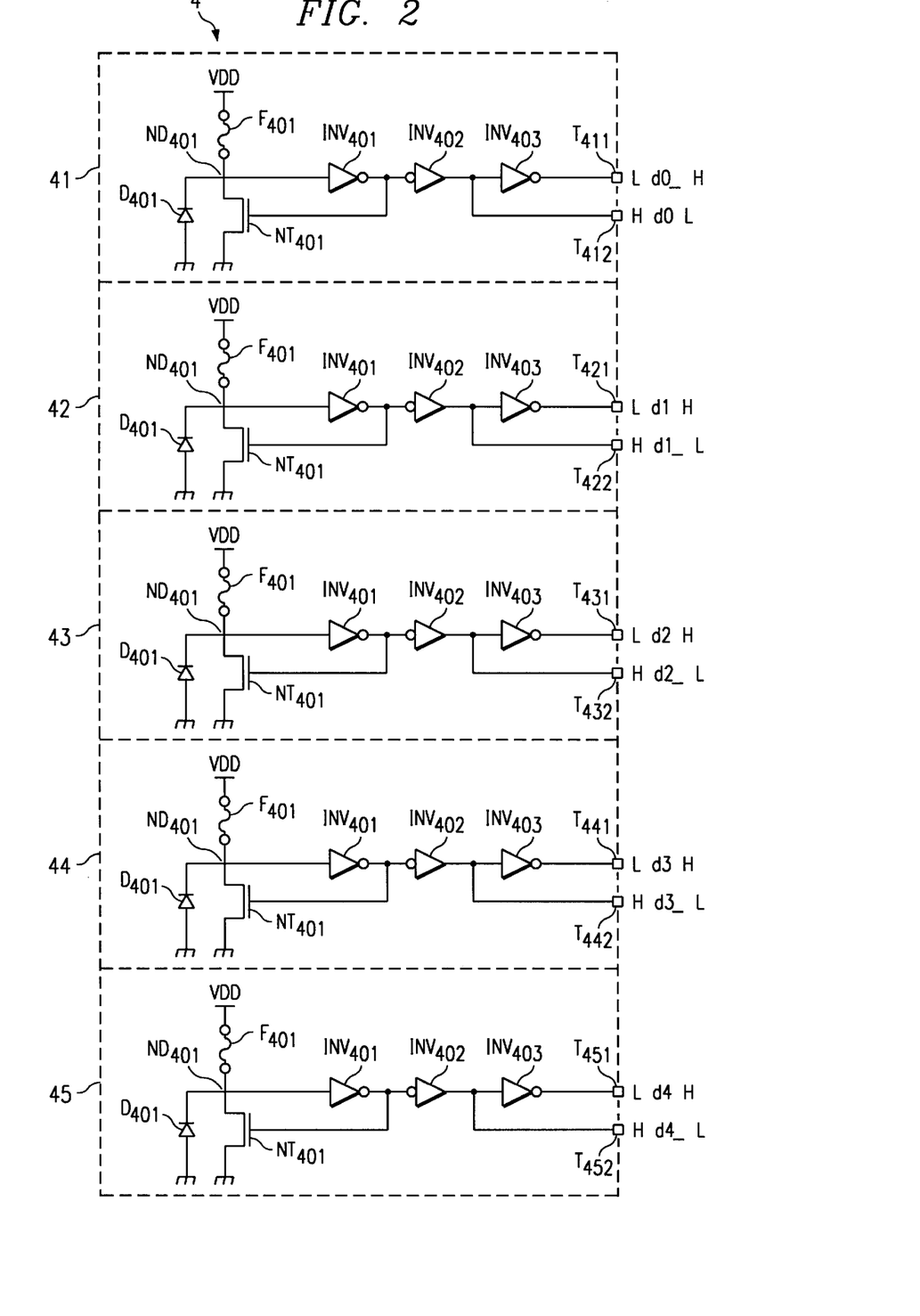
FIG. 2 is a circuit diagram showing an example of a clock delay selecting circuit in accordance with the invention.

FIG. 1 and FIG. 2 are circuit diagrams showing one embodiment of a clock signal generating circuit in accordance with the invention. FIG. 1 is a main part circuit diagram of a clock signal generating circuit, and FIG. 2 is a circuit diagram showing a constitutional example of a clock delay selecting circuit.

In FIG. 1 and FIG. 2, $T_{CLK}$ indicates the input terminal of basic clock signal CLK (hereafter referred to as the clock signal input terminal), $T_{CTL}$ the input terminal for control signal CTL (hereafter referred to as the control signal input terminal), 1M the master clock level selecting circuit, 1S the slave clock level selecting circuit, 2M the master clock signal generating circuit, 2S the slave clock signal generating circuit, 3M the master clock delay generating circuit, 3S the slave clock delay generating circuit, 4 the clock delay selecting circuit, and $INV_1$–$INV_6$ the inverters.

Master clock level selecting circuit 1M selectively outputs basic clock signal CLK according to the input level of control signal CTL.

Specifically, when control signal CTL is input into control signal input terminal $T_{CTL}$ at a high level, the basic clock signal CLK is output selectively, and when control signal CTL is input into input terminal $T_{CTL}$ at a low level, the output is fixed to the ground level.

Master clock level selecting circuit 1M may comprise transfer gate $TFG_{M11}$ and transfer gate $TFG_{M12}$ which are formed by connecting the source and drain of p-channel MOS (pMOS) transistor and n-channel MOS (nMOS) transistor, and these are connected as follows.

One input/output terminal of transfer gate $TFG_{M11}$ is grounded, one input/output terminal of transfer gate $TFG_{M12}$ is connected to the output of inverter $INV_1$, and the input of inverter $INV_1$, is connected to clock signal input terminal $T_{CLK}$.

The gates of the nMOS transistor forming transfer gate $TFG_{M12}$ and of the pMOS transistor forming transfer gate $TFG_{M11}$ are respectively connected to control signal input terminal $T_{CTL}$, the gates of pMOS transistor forming transfer gate $TFG_{M12}$ and of the nMOS transistor forming transfer gate $TFG_{M11}$ are respectively connected to the output of inverter $INV_2$, and the input of inverter $INV_2$ is connected to control signal input terminal $T_{CTL}$.

The other input/output terminals of transfer gates $TFG_{M11}$ and $TFG_{M12}$ are mutually connected to form output node $ND_{M1}$, and output node $ND_{M1}$ is connected to master clock signal generating circuit 2M via serially connected inverters $INV_3$ and $INV_4$.

Slave clock level selecting circuit 1S selectively outputs basic clock signal CLK according to the input level of control signal CTL.

Specifically, when control signal CTL is input into control signal input terminal $T_{CTL}$ at a high level, basic clock signal CLK is selectively output and when control signal CTL is input into input terminal $T_{CTL}$ at a low level, the output is fixed to the power source voltage $V_{DD}$ level.

Slave clock level selecting circuit 1S comprises, for example, transfer gate $TFG_{S11}$ and transfer gate $TFG_{S12}$ formed by mutually connecting the source and drain of the pMOS transistor and the nMOS transistor, and these are connected as follows.

One input/output terminal of transfer gate $TFG_{S11}$, is connected to the power source voltage feed line $V_{DD}$ and one input/output terminal of transfer gate $TFG_{S12}$ is connected to clock signal input terminal $T_{CLK}$.

The gate of pMOS transistor forming transfer gate $TFG_{S11}$, and the gate of nMOS transistor forming transfer gate $TFG_{S12}$ are connected to control signal input terminal $T_{CTL}$, and the gate of nMOS transistor forming transfer gate $TFG_{S11}$ and the gate of pMOS transistor forming transfer gate $TFG_{S12}$ are connected to control signal input terminal $T_{CTL}$ via inverter $INV_2$.

The other input/output terminals of transfer gates $TFG_{S11}$ and $TFG_{S12}$ are connected to form output node $ND_{S1}$, and output node $ND_{S1}$ is connected to slave clock signal generating circuit 2S via serially connected inverters $INV_5$ and $INV_6$.

Master clock signal generating circuit 2M generates master clock signal MCLK at the low level or the high level based on the slave clock signal which has been delayed by a prescribed time by clock delay generating circuit 3M and the output signal of master clock level selecting circuit 1M.

The master clock signal generating circuit 2M comprises, for example, pMOS transistors $PT_{M21}$–$PT_{M25}$, nMOS transistors $NT_{M21}$–$NT_{M25}$, and inverter $INV_{M21}$, and these are connected as follows.

The sources of pMOS transistors $PT_{M21}$, $PT_{M23}$, and $PT_{M25}$ are connected to the power voltage feed line $V_{DD}$, and the sources of nMOS transistors $NT_{M24}$ and $NT_{M25}$ are grounded.

pMOS transistor $PT_{M21}$, and nMOS transistors $NT_{M21}$, and $NTM_{22}$, pMOS transistor $PTM_{22}$ and nMOS transistors $NT_{M23}$ and $NT_{M24}$, pMOS transistor $PT_{M23}$ and pMOS transistor $PT_{M24}$, and pMOS transistor $PT_{M25}$ and nMOS transistor $NT_{M25}$ are respectively connected in series, and output node $ND_{M21}$ is formed as the node point connected between the drains of pMOS transistor $PT_{M25}$ and nMOS transistor $NT_{M25}$.

The node point of the drains of PMOS transistor $PT_{M21}$ and nMOS transistor $NT_{M21}$, and the node point of the drain of PMOS transistor $PT_{M23}$ and the source of pMOS transistor $PT_{M24}$ are connected, and these node points are respectively connected to the gate of pMOS transistor $PT_{M25}$ and the source of PMOS transistor $PT_{M22}$.

Also, the node point of the drains of PMOS transistor $PT_{M22}$ and nMOS transistor $NT_{M23}$ is connected to the drain of pMOS transistor $PT_{M24}$, the source of nMOS transistor $NT_{M22}$, and the gate of nMOS transistor $NT_{M25}$.

Furthermore, the gates of pMOS transistors $PT_{M23}$ and $PT_{M24}$ and nMOS transistors $NT_{M22}$ and $NT_{M24}$ are connected to the output of inverter $INV_4$, and the gates of pMOS transistors $PT_{M21}$, and $PT_{M22}$ and nMOS transistors $NT_{M21}$ and $NT_{M23}$ are connected to the output of inverter $INV_{M21}$. The input of inverter $INV_{M21}$ is connected to the output of master clock delay generating circuit 3M.

Slave clock signal generating circuit 2S generates slave clock signals SCLK at the low level or the high level based on the master clock signal which has been delayed by a prescribed time by clock delay generating circuit 3S and output signal of slave clock level selecting circuit 1S.

The slave clock signal generating circuit 2S comprises, for example, pMOS transistors $PT_{S21}$–$PT_{S25}$, nMOS transistors $NT_{S21}$–$NT_{S25}$, and inverter $INV_{S21}$, and these are connected as follows.

The sources of pMOS transistors $PT_{S21}$, $PT_{S23}$, and $PT_{S25}$ are connected to the power voltage feed line $V_{DD}$, and the sources of nMOS transistors $NT_{S24}$ and $NT_{S25}$ are grounded.

PMOS transistor $PT_{S21}$ and nMOS transistors $NT_{S21}$ and $NT_{S22}$, PMOS transistor $PT_{S22}$ and nMOS transistors $NT_{S23}$ and $NT_{S24}$, pMOS transistor $PT_{S23}$ and pMOS transistor $PT_{S24}$, and pMOS transistor $PT_{S25}$ and nMOS transistor $NT_{S25}$ are respectively connected in series and output node $ND_{S21}$ is formed by the node point connected between the drains of pMOS transistor $PT_{S25}$ and nMOS transistor $NT_{S25}$.

The node point of the drains of pMOS transistor $PT_{S21}$ and nMOS transistor $NT_{S21}$ and the node point of the drain of pMOS transistor $PT_{S23}$ and source of pMOS transistor $PT_{S24}$ are connected, and these node points are respectively connected to the gate of pMOS transistor $PT_{S25}$ and the source of pMOS transistor $PT_{S22}$.

Also, the node point of the drains of pMOS transistor $PT_{S22}$ and nMOS transistor $NT_{S23}$ is connected to the drain of pMOS transistor $PT_{S24}$, the source of nMOS transistor $NT_{S22}$, and the gate of nMOS transistor $NT_{S25}$.

Furthermore, the gates of pMOS transistors $PT_{S23}$ and $PT_{S24}$ and NMOS transistors $NT_{S22}$ and $NT_{S24}$ are connected to the output of inverter $INV_6$, and the gates of pMOS transistors $PT_{S21}$ and $PT_{S22}$ and nMOS transistors $NT_{S21}$ and $NT_{S23}$ are connected to the output of inverter $INV_{S21}$. The input of inverter $INV_{S21}$ is connected to the output of slave clock delay generating circuit 3S.

Master clock delay generating circuit 3M outputs slave clock signal SCLK generated in slave clock signal generating circuit 2S to master clock signal generating circuit 2M by applying a delay time selected by clock delay selecting circuit 4 shown in FIG. 2.

The master clock delay generating circuit 3M comprises transfer gates $TFG_{M31}$–$TFG_{M35}$ which are mutually connected in parallel by connecting the source and drain of the pMOS transistors and nMOS transistors, and inverters $INV_{M31}$–$INV_{M38}$ connected in series in the order noted, and these are connected as follows.

One input/output terminal of transfer gate $TFG_{M31}$ is connected to the input of inverter $INV_{M31}$ and output node $ND_{S21}$ of slave clock signal generating circuit 2S. One input/output terminal of transfer gate $TFG_{M32}$ is connected to the node point of the input of inverter $INV_{M33}$ and output of inverter $INV_{M32}$, one input/output terminal of transfer gate $TFG_{M33}$ is connected to the node point of the input of inverter $INV_{M35}$ and the output of inverter $INV_{M34}$, one input/output terminal of transfer gate $TFG_{M34}$ is connected to the node point of the input of inverter $INV_{M37}$ and the output of inverter $INV_{M36}$, and one input/output terminal of transfer gate $TFG_{M35}$ is connected to the output of inverter $INV_{M38}$.

The other input/output terminals of transfer gates $TFG_{M31}$–$TFG_{M35}$ are mutually connected and the node points are connected to the input of inverter $INV_{M21}$ in master clock signal generating circuit 2M.

Two output signals $d_0$, $d_{0\_}$, $d_1$, $d_{1\_}$, $d_2$, $d_{2\_}$, $d_3$, $d_{3\_}$, $d_4$, $d_{4\_}$ which take the complementary level of delay selection parts 41–45 in clock delay selecting circuit 4 shown in FIG. 2, regarding which details will be explained later, are fed to the gates of pMOS and nMOS transistors forming transfer gates $TFG_{M31}$–$TFG_{M35}$.

With these complementary signals, one transfer gate is selected. In this example, the delay time is shorter in a case when transfer gate $TFG_{M31}$ is selected and the delay time is longest in a case when transfer gate $TFG_{M35}$ is selected.

Slave clock delay generating circuit 3S outputs master clock signal MCLK generated in master clock signal generating circuit 2M to slave clock signal generating circuit 2S by delaying for a delay time selected by clock delay selecting circuit 4 shown in FIG. 2.

The slave clock delay generating circuit 3S comprises transfer gates $TFG_{S31}$–$TFG_{S35}$ which are mutually connected in parallel by connecting the source and drain of pMOS transistors and nMOS transistors, and inverters $INV_{S31}$–$INV_{S38}$ serially connected in the order noted, and these are connected as follows.

One input/output terminal of transfer gate $TFG_{S31}$ is connected to the input of inverter $INV_{S31}$ and output node $ND_{M21}$ of master clock signal generating circuit 2M. One input/output terminal of transfer gate $TFG_{S32}$ is connected to the node point of the input of inverter $INV_{S33}$ and the output of inverter $INV_{S32}$, one input/output terminal of transfer gate $TFG_{S33}$ is connected to the node point of the input of inverter $INV_{S35}$ and the output of inverter $INV_{S34}$, one input/output terminal of transfer gate $TFG_{S34}$ is connected to the node point of the input of inverter $INV_{S37}$ and the output of inverter $INV_{S36}$, and one input/output terminal of transfer gate $TFG_{S35}$ is connected to the output of inverter $INV_{S38}$.

The other input/output terminals of transfer gates $TFG_{S31}$–$TFG_{S35}$ are mutually connected and these node points are connected to the input of inverter $INV_{S21}$ of slave clock signal generating circuit 2S.

Two output signals $d_0$, $d_{0\_}$, $d_1$, $d_{1\_}$, $d_2$, $d_{2\_}$, $d_3$, $d_{3\_}$, $d_4$, $d_{4\_}$ with the respective level of delay selection parts 41–45 in clock delay selecting circuit 4 shown in FIG. 2, regarding which details will be discussed later, are respectively fed to each gate of pMOS transistors and nMOS transistors forming transfer gates $TFG_{S31}$–$TFG_{S35}$ in the same manner as master clock delay generating circuit 3M.

With these complementary signals, one transfer gate is selected; the delay time is shorter in a case when transfer gate $TFG_{S31}$ is selected, and the delay time is longest in a case when transfer gate $TFG_{S35}$ is selected.

Clock delay selecting circuit 4 comprises clock delay selection parts 41–45 provided to correspond respectively with transfer gates $TFG_{M31}$ and $TFG_{S31}$, $TFG_{M32}$ and $TFG_{S32}$, $TFG_{M33}$ and $TFG_{S33}$, $TFG_{M34}$ and $TFG_{S34}$, and $TFG_{M35}$ and $TFG_{S35}$ of slave clock delay generating circuit 3S and master clock delay generating circuit 3M as shown in FIG. 2.

The clock delay selection parts 41–45 have identical structures, each comprising fuse $F_{401}$ formed of, for example, aluminum Al, diode $D_{401}$, nMOS transistor $NT_{401}$, and serially connected inverters $INV_{401}$–$INV_{403}$. Also, each clock delay selection part 41–45 respectively has two output terminals $T_{411}$, $T_{412}$, $T_{421}$, $T_{422}$, $T_{431}$, $T_{432}$, $T_{441}$, $T_{442}$, $T_{451}$, $T_{452}$ and these are connected as follows.

One terminal of fuse $F_{401}$ is connected to the feed line of power voltage $V_{dd}$, the other terminal is connected to the input of inverter $INV_{401}$, the drain of nMOS transistor $NT_{401}$, and the cathode of diode $D_{401}$, and node $ND_{401}$ is formed from the center point of these connections.

The gate of nMOS transistor $NT_{401}$ is connected to the node point of the input of inverter $INV_{402}$ and the output of inverter $INV_{401}$, the output of inverter $INV_{403}$ is connected to output terminals $T_{411}$–$T_{451}$, and the node point of the input of inverter $INV_{403}$ and the output of inverter $INV_{402}$ is connected to output terminals $T_{421}$–$T_{452}$. Also, the anode of diode $D_{401}$ and the source of nMOS transistor $NT_{401}$ are grounded.

Signals $d_{0\_}$, $d_1$–$d_4$ at low level "L" are output from output terminals $T_{411}$–$T_{451}$, connected to the output of inverter $INV_{403}$ in each clock delay selection parts 41–45 when fuse $F_{401}$ is not cutoff by laser, and when fuse $F_{401}$ is cutoff by laser, signals $d_{0\_}$, $d_1$–$d_4$ at high level "H" are output.

On the contrary, signals $d_{0,\ d1\_}$–$d_{4\_}$ at high level "H" are output from output terminals $T_{412}$–$T_{452}$ connected to the output of inverter $INV_{402}$ in each clock delay selection parts 41–45 when fuse $F_{401}$ is not cutoff by laser, and signals $d_0$, $d_{1\_}$–$d_{4\_}$ at low level "L" are output when fuse $F_{40}$ is cutoff by laser.

Output terminal $T_{411}$, of clock delay selection part 41 is connected respectively to the gate of pMOS transistor forming initial stage transfer gate $TFG_{S31}$ of slave clock delay generating circuit 3S and the gate of pMOS transistor forming initial stage transfer gate $TFG_{M31}$ of master clock delay generating circuit 3M shown in FIG. 1.

On the contrary, output terminal $T_{412}$ is connected respectively to the gate of nMOS transistor forming initial stage transfer gate $TFG_{S31}$, of slave clock delay generating circuit 3S and the gate of nMOS transistor forming the initial stage transfer gate $TFG_{M31}$ of master clock delay generating circuit 3M.

Output terminal $T_{421}$ of clock delay selection part 42 is connected respectively to the gate of the nMOS transistor forming second stage transfer gate $TFG_{S32}$ of slave clock delay generating circuit 3S and to the gate of nMOS transistor forming second stage transfer gate $TFG_{M32}$ of master clock delay generating circuit 3M shown in FIG. 1.

On the contrary, output terminal $T_{422}$ is connected respectively to the gate of the pMOS transistor forming second stage transfer gate $TFG_{M32}$ of master clock delay generating circuit 3M and to the gate of the pMOS transistor forming second stage transfer gate $TFG_{S32}$ of slave clock delay generating circuit 3S.

Similarly, output terminal $T_{431}$ of clock delay selecting part 43 is connected respectively to the gate of the nMOS transistor forming third stage transfer gate $TFG_{M33}$ of master clock delay generating circuit 3M shown in FIG. 1 and to the gate of nMOS transistor forming third stage transfer gate $TFG_{S33}$ of slave clock delay generating circuit 3S.

On the contrary, output terminal $T_{432}$ is connected respectively to the gate of the pMOS transistor forming third stage transfer gate $TFG_{M33}$ of master clock delay generating circuit 3M and the gate of the pMOS transistor forming thirdstage transfer gate $TFG_{S33}$ of slave clock delay generating circuit 3S.

Output terminal $T_{441}$ of clock delay selection part 44 is connected respectively to the gate of the NMOS transistor forming fourth stage transfer gate $TFG_{M34}$ of master clock delay generating circuit 3M shown in FIG. 1 and to the gate of nMOS transistor forming fourth stage transfer gate $TFG_{S34}$ of slave clock delay generating circuit 3S.

On the contrary, output terminal $T_{442}$ is connected respectively to the gate of the pMOS transistor forming fourth stage transfer gate $TFG_{M34}$ of master clock delay generating circuit 3M and to the gate of the pMOS transistor forming fourth stage transfer gate $TFG_{S34}$ of slave clock delay generating circuit 3S.

Output terminal $T_{451}$ of clock delay selection part 45 is connected respectively to the gate of the nMOS transistor forming fifth stage transfer gate $TFG_{M35}$ of master clock delay generating circuit 3M shown in FIG. 1, and to the gate of the nMOS transistor forming fifth stage transfer gate $TFG_{S35}$ of slave clock delay generating circuit 3S.

On the contrary, output terminal $T_{452}$ is connected respectively to the gate of the pMOS transistor forming fifth stage transfer gate $TFG_{M35}$ of master clock delay generating circuit 3M, and to the gate of the pMOS transistor forming fifth stage transfer gate $TFG_{S35}$ of slave clock delay generating circuit 3S.

As noted above, initial transfer gates $TFG_{M31}$ and $TFG_{S31}$ of master and slave clock delay generating circuits 3M and 3S are maintained on conductive by output signals $d_0$ and $d_0$ of clock delay selection part 41 in clock delay selecting circuit 4, and other transfer gates $TFG_{M32}$–$TFG_{M35}$ and $TFG_{S32}$–$TFG_{S35}$ are maintained off (nonconductive) at the initial state.

Namely, the clock signal generating circuit is structured so that the isolation time IT of the master clock signal MCLK and the slave clock signal SCLK becomes the shortest and the actual operation time becomes long.

If clock skew occurs in this type of structure, along with fuse $F_{401}$ of clock delay selection part 41 being cut off by laser in order to make the isolation time IT long, and the initial stage transfer gates $TFG_{M31}$ and $TFG_{S31}$ of master and slave clock delay generating circuits 3M and 3S being switched off, fuse $F_{401}$ of clock delay selection part 41 among clock delay selection parts 42–45 is cut off in order to apply the necessary delay time and prescribed stage transfer gates $TFG_{M32}$–$TFG_{M35}$ and $TFG_{S32}$–$TFG_{S35}$ of master and slave clock delay generating circuits 3M and 3S connected to the output terminal of said clock delay selection part are switched on as a pair.

Figure 3:
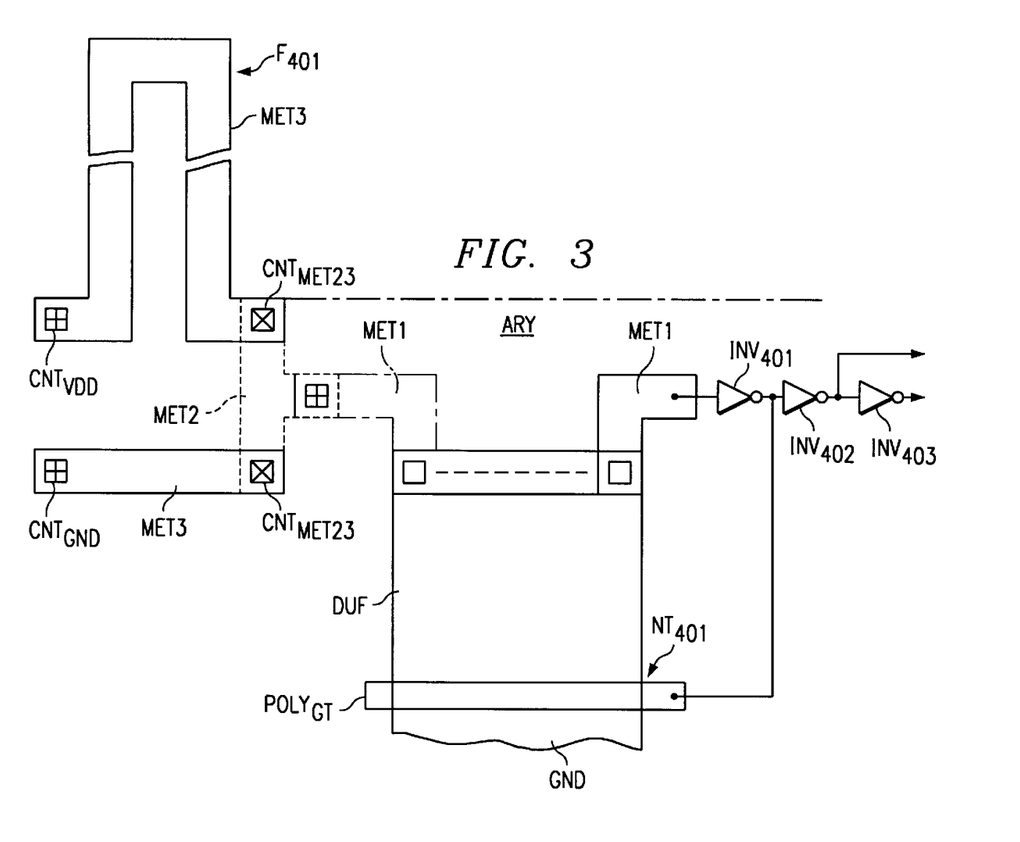
FIG. 3 is a diagrammatic illustration showing a circuit pattern example of a clock delay selecting circuit in accordance with the invention.

FIG. 3 illustrates a circuit pattern example of clock delay selection parts 41–45 in clock delay selecting circuit 4 shown in FIG. 2.

MET1 indicates the first aluminum layer, MET2 a second aluminum layer, MET3 the third aluminum layer, $POLY_{GT}$ the gate formed of polysilicon layer of nMOS transistor $NT_{401}$, DUF the drain diffusion layer, $CNT_{VDD}$ the contact to the power voltage feed line $V_{DD}$, $CNT_{GND}$ the contact to the ground line, $CNT_{MET23}$ the contact to second aluminum layer MET2 and third aluminum layer MET3, and $CNT_{MET12}$ the contact to first aluminum layer MET1 and second aluminum layer MET2.

The clock delay selecting circuit is in a three layer aluminum structure, each fuse $F_{401}$ is formed of the third aluminum layer, and is formed in an approximate U shape protruding from element arrangement part ARY of transistor, etc. as shown in FIG. 3.

Therefore, the cutoff of fuse $F_{401}$ by a laser can be executed easily without affecting the other elements.

Next, the operation of the clock signal generating circuit will be explained.

In normal operation, control signal CTL is input into control signal input terminal $T_{CTL}$ at a high level.

As a result, transfer gate $TFG_{M11}$ is maintained off nonconductive in master clock level selecting circuit 1M, and transfer gate $TFG_{M12}$ on (conductive).

Similarly, transfer gate $TFG_{S11}$ is maintained off (nonconductive) in slave clock level selecting circuit 1S and transfer gate $TFG_{S12}$ is maintained on (conductive).

That is to say, in the case of normal operation, clock signal CLK is selected.

Here, if clock signal CLK is input at a low level with respect to clock signal input terminal $T_{CLK}$, the low level clock signal CLK is input into the slave clock level selecting circuit 1S unchanged at the low level, and clock signal CLK at the high level which was level inverted in inverter $INV_1$ is input into the master clock level selecting circuit 1M.

Clock signal CLK at a high level input into master clock level selecting circuit 1M is input into master clock signal generating circuit 2M at the high level via two inverters $INV_3$ and $INV_4$ by passing through transfer gate $TFG_{M12}$.

Also, clock signal CLK at a low level input into slave clock level selecting circuit 1S is input into slave clock signal generating circuit 2S at the low level via two inverters $INV_5$ and $INV_6$ by passing through transfer gate $TFG_{S12}$.

The clock signal at a high level input into master clock signal generating circuit 2M is fed to the gates of nMOS transistors $NT_{M22}$ and $NT_{M24}$ and pMOS transistors $PT_{M23}$ and $PT_{M24}$. As a result, NMOS transistors $NT_{M22}$ and $NT_{M24}$ are maintained on and pMOS transistors $PT_{M23}$ and $PT_{M24}$ are maintained off.

Also, the clock signal at a low level input into slave clock signal generating circuit 2S is fed into the gates of nMOS transistors $NT_{S22}$ and $NT_{S24}$ and pMOS transistors $PT_{S23}$ and $PT_{S24}$. As a result, nMOS transistors $NT_{S22}$ and $NT_{S24}$ are maintained off and pMOS transistors $PT_{S23}$ and $PT_{S24}$ are maintained on.

Power voltage $V_{DD}$ at the high level is fed to the gates of output stage pMOS transistor $PT_{S25}$ and nMOS transistor $NT_{S25}$ in accordance with pMOS transistors $PT_{S23}$ and $PT_{S24}$ having turned on.

Thereby, pMOS transistor $PT_{S25}$, is maintained off and nMOS transistor $NT_{S25}$ is turned on.

As a result, output node $ND_{S21}$ of slave clock signal generating circuit 2S is pulled to the ground level. Consequently, slave clock signal SCLK at the low level is output from slave clock signal generating circuit 2S. Also, slave clock signal SCLK at the low level is input into master clock delay generating circuit 3M.

At this time, only initial stage transfer gate $TFG_{M31}$ is maintained conductive by clock delay selecting circuit 4 in master clock delay generating circuit 3M, and slave clock signal CLK at a low level is input into master clock signal generating circuit 2M through said transfer gate $TFG_{M31}$.

Slave clock signal at the low level input into master clock signal generating circuit 2M undergoes level inversion in inverter $INV_{M21}$, and then is fed to the gates of nMOS transistors $NT_{M21}$ and $NT_{M23}$ and pMOS transistors $PT_{M21}$ and $PT_{M22}$. As a result, nMOS transistors $NT_{M21}$ and $NT_{M23}$ are switched on and pMOS transistors $PT_{M21}$ and $PT_{M22}$ are switched off.

Thereby, the gate potential of output stage nMOS transistor $NT_{M25}$ is pulled to the ground level via nMOS transistors $NT_{M23}$ and $NT_{M24}$. Similarly, the gate potential of pMOS transistor $PT_{M25}$ is pulled to the ground level via nMOS transistors $NT_{M21}$–$NT_{M24}$.

As a result, nMOS transistor $NT_{M25}$ is switched off, pMOS transistor $PT_{M25}$ switches on, and power voltage $V_{DD}$ at the high level is fed to output node $ND_{M21}$ of master clock signal generating circuit 2M. Thereby, master clock signal MCLK at the high level is output from master clock signal generating circuit 2M. Also, the master clock signal MCLK at the high level is input into slave clock delay generating circuit 3S.

At this time, only initial stage transfer gate $TFG_{S31}$ is maintained conductive by clock delay selecting circuit 4 of slave clock delay generating circuit 3S, and master clock signal MCLK at a high level is input into slave clock signal generating circuit 2S through said transfer gate $TFG_{S31}$.

The master clock signal at the high level input into slave clock signal generating circuit 2S undergoes level inversion in inverter $INV_{S21}$, and is then fed to the gates of nMOS transistors $NT_{S21}$ and $NT_{S23}$ and pMOS transistors $PT_{S21}$ and $PT_{S22}$. As a result, nMOS transistors $NT_{S21}$ and $NT_{S23}$ are maintained off and pMOS transistors $PT_{S21}$ and $PT_{S22}$ are switched on.

Thereby, the gate potential of output stage nMOS transistor $NT_{S25}$ and pMOS transistor $PT_{S25}$ is maintained stably at the power voltage $V_{DD}$ level. As a result, slave clock signal SCLK at the low level is output stably from slave clock signal generating circuit 2S.

As noted above, master clock signal MCLK is maintained at the same level as slave clock signal SCLK at a low level during the period from when basic clock signal CLK is input until slave clock signal SCLK generated in slave clock signal generating circuit 2S is input. That is to say, an isolation time IT is provided for master clock signal MCLK and slave clock signal SCLK.

Next, if clock signal CLK is input into clock signal input terminal $T_{CLK}$ by being switched to a high level from a low level, the high level clock signal CLK is input into slave clock signal generating circuit 2S unchanged at the high level via transfer gate $TFG_{S12}$ of slave clock level selecting circuit 1S and two inverters $INV_5$ and $INV_6$.

Also, clock signal CLK at the low level which underwent level inversion in inverter $INV_1$, is input into master clock signal generating circuit 2M via transfer gate $TFG_{M12}$ of master clock level selecting circuit 1M and two inverters $INV_3$ and $INV_4$.

The clock signal at the high level input into slave clock signal generating circuit 2S is fed to the gates of nMOS transistors $NT_{S22}$ and $NT_{S24}$ and pMOS transistors $PT_{S23}$ and $PT_{S24}$. As a result, nMOS transistors $NT_{S22}$ and $NT_{S24}$ are switched on and pMOS transistors $PT_{S23}$ and $PT_{S24}$ are switched off.

Thereby, the feeding of power voltage $V_{DD}$ into the gates of output stage pMOS transistor $PT_{M25}$ and nMOS transistor $NT_{M25}$ is stopped but pMOS transistors $PT_{S21}$ and $PT_{S22}$ are on, so slave clock signal SCLK is maintained unchanged at the low level.

The clock signal at the low level input into master clock signal generating circuit 2M is fed to the gates of nMOS transistors $NT_{M22}$ and $NT_{M24}$ and pMOS transistors $PT_{M23}$ and $PT_{M24}$. As a result, nMOS transistors $NT_{M22}$ and $NT_{M24}$ are switched off and pMOS transistors $PT_{M23}$ and $PT_{M24}$ are switched on.

With the switching off of nMOS transistors $NT_{M22}$ and $NT_{M24}$, pulling of the gate potential of output stage pMOS transistor $PT_{M25}$ and nMOS transistor $NT_{M25}$ to the ground level is stopped. On the other hand, with the switching on of pMOS transistors $PT_{M23}$ and $PT_{M24}$, high level power voltage $V_{DD}$ is fed to the gates of output stage pMOS transistor $PT_{M25}$ and nMOS transistor $NT_{M25}$.

Thereby, pMOS transistor $PT_{M25}$ switches off and nMOS transistor $NT_{M25}$ switches on.

As a result, output node $ND_{M21}$ of master clock signal generating circuit 2M is pulled to the ground level. Consequently, master clock signal MCLK switched to the low level from the high level is output from master clock signal generating circuit 2M regardless of the level of slave clock signal SCLK. The low level master clock signal MCLK is input into slave clock delay generating circuit 3S.

At this time, only initial stage transfer gate $TFG_{S31}$ is maintained conductive by clock delay selecting circuit 4 in slave clock delay generating circuit 3S and master clock signal MCLK at the low level is input into slave clock signal generating circuit 2S through transfer gate $TFG_{S31}$.

The master clock signal at the low level input into slave clock signal generating circuit 2S undergoes level inversion in inverter $INV_{S21}$, and then is fed to the gates of nMOS transistors $NT_{S21}$ and $NT_{S23}$ and pMOS transistors $PT_{S21}$ and $PT_{S22}$ at the high level. As a result, nMOS transistors $NT_{S21}$ and $NT_{S23}$ are switched on and pMOS transistors $PT_{S21}$ and $PT_{S22}$ are switched off.

Thereby, the gate potential of output stage nMOS transistor $NT_{S25}$ is pulled to the ground level via nMOS transistors $NT_{S23}$ and $NT_{S24}$. Similarly, the gate potential of pMOS transistor $PT_{S25}$ is pulled to the ground level via nMOS transistors $(NT_{S21})$–$(NT_{S24})$.

As a result, nMOS transistor $NT_{S25}$ switches off, pMOS transistor $PT_{S25}$ switches on, and high level power voltage $V_{DD}$ is fed to output node $ND_{S21}$ of slave clock signal generating circuit (2S). Thereby, slave clock signal SCLK at the high level is output from slave clock signal generating circuit 2S. The slave clock signal SCLK at the high level is input into master clock delay generating circuit 3M.

At this time, only initial stage transfer gate $TFG_{M31}$ is maintained conductive by clock delay selecting circuit 4 in master clock delay generating circuit 3M and slave clock signal SCLK at a high level is input into master clock signal generating circuit 2M through said transfer gate $TFG_{M31}$.

The slave clock signal at the high level input into master clock signal generating circuit 2M undergoes level inversion in inverter $INV_{M21}$, and then is fed to the gates of nMOS transistors $NT_{M21}$ and $NT_{M23}$ and pMOS transistors $PT_{M21}$ and $PT_{M22}$ at the low level. As a result, nMOS transistors $NT_{M21}$ and $NT_{M23}$ are switched off and pMOS transistors $PT_{M21}$, and $PT_{M22}$ are switched on.

Thereby, the gate potential of output stage NMOS transistor $NTM_{25}$ and pMOS transistor $PT_{M25}$ is maintained stably at the power voltage $V_{DD}$ level. As a result, master clock signal MCLK at a low level is output stably from master clock signal generating circuit 2M.

Consequently, slave clock signal SCLK is maintained at the same level as low level master clock signal MCLK during the time from when basic clock signal CLK is input until master clock signal MCLK is input. That is, master clock signal MCLK and slave clock signal SCLK have been given an isolation time IT.

Thereafter, the operation is repeated but as mentioned above, the time when master clock signal MCLK is maintained at a high level is shorter than the time when slave clock signal SCLK is maintained at a low level.

That is, the isolation time when both signals assume a low level is set, then output.

If clock skew occurs during the operation, fuse $F_{401}$ of clock delay selection part 41 in clock delay selecting circuit 4 and fuse $F_{401}$ of the clock delay selection part among clock delay selection parts 42–45 which can be set with the necessary delay time are cutoff by laser in order to set the isolation time longer.

Thereby, the paths of slave clock signal SCLK and master clock signal MCLK pass through master and slave clock delay generating circuits 3M and 3S.

Also, in other than normal operation, such as an idle mode of stopping the CPU or stopping also the peripheral elements, control signal CTL is set at a low level.

As a result, transfer gate $TFG_{M12}$ is controlled to be nonconductive and transfer gate $TFG_{M11}$ to be conductive in master clock level selecting circuit 1M. Thereby, the output of master clock level selecting circuit 1M is fixed at the ground level, namely, the low level.

Consequently, master clock signal MCLK is also fixed at the low level.

Similarly, transfer gate $TFG_{S12}$ is controlled to be non-conductive and transfer gate $TFG_{S11}$ to be conductive in slave clock level selecting circuit 1S. Thereby, the output of slave clock level selecting circuit 1S is held at the power voltage $V_{DD}$ level, namely, the high level.

Consequently, slave clock signal SCLK is fixed at a high level.

As explained above, according to the embodiment, master clock signal generating circuit 2M which generates master clock signal MCLK at a high level based on slave clock signal SCLK being at a low level and basic clock signal CLK being at a low level and generates master clock signal MCLK at a low level based on basic clock signal CLK being at a high level, slave clock signal generating circuit 2S which generates slave clock signal SCLK at a low level based on basic clock signal CLK being at a low level and generates slave clock signal SCLK at a high level based on the master clock signal being at a low level and basic clock signal CLK being at a high level, master clock delay generating circuit 2M which inputs slave clock signal SCLK output from slave clock signal generating circuit 2S to be able to set the delay time optionally into master clock signal generating circuit 2M by delaying the necessary time, and slave clock delay generating circuit (3S) which inputs the output from master clock signal generating circuit (2M) is to be able to set the delay time optionally into slave clock signal generating circuit (2S) by delaying for the necessary time have been provided, so clock control is easy, the isolation time can be set suitably, occurrence of clock skew can be prevented, and through current flowing in the transistors in the final buffer stage can be prevented.

Since the isolation time can be set to the necessary time, for example, it is easy to suppress the clock skew generated afterwards and the limit of the actual device can easily be evaluated.

Also, the same circuit configuration as a NAND circuit is used in master clock signal generating circuit 2M and slave clock signal generating circuit 2S so the response speed is fast and the transistor size can be made small.

Furthermore, the isolation time can be controlled by optionally cutting off the fuse so all that is necessary is to program the fuse at the final stage of the manufacturing process for semiconductor devices and it is not necessary to change the design of the semiconductor device. Consequently, the development time for the semiconductor device can be reduced.

As explained above, according to the present invention, control of the clock is easy, the isolation time can be set suitably, generation of clock skew can be prevented, and the through current flowing in the transistor in the final buffer stage can be prevented.

Also, a delay time can be set optionally so there are advantages such as being able to set the isolation time to the necessary time, suppress the clock skew generated afterwards easily, and the limit of the actual device can easily be evaluated.

We claim:

1. A non-overlapping clock signal generating circuit, comprising:
    a first clock signal generating circuit which generates a first clock signal of a first level based on a basic clock signal at the first level, and the first clock signal at a second level based on the basic clock signal at the second level and a delayed second clock signal at the first level, the first clock signal generating circuit having a first output for providing the first clock signal to an external circuit;
    a second clock signal generating circuit which generates a second clock signal at the second level based on the basic clock signal at the first level and a delayed first clock signal at the first level, and the second clock signal at the first level based on the basic clock signal at the second level, the second clock signal generating circuit having a second output for providing the second clock signal to an external circuit;
    a first clock signal delay circuit which delays the first clock signal for a prescribed time and inputs the delayed first clock signal into the second clock signal generating circuit and a second clock signal delay circuit which delays the second clock signal for a prescribed time and inputs the delayed second clock signal into the first clock signal generating circuit, such that the first clock signal and the second clock signal do not overlap, the first clock signal delay circuit and second clock signal delay circuit each include plural delay paths with different delay timing and plural switching means provided to each delay path;
    each of the plural delay paths comprising a delay element and one of the plurality of switching means, the delay time of the first clock signal and the second clock signal being set by selectively actuating one or more of the plurality of switching means to connect respective delay elements;
    wherein the first clock signal generating circuit further comprises a first delay circuit connected to a first output transistor, and a second delay circuit connected to a second output transistor, the first output transistor being connected in series with the second output transistor at a first node which is the first output of the first clock signal generating circuit, the first delay circuit responsively connected to the second output transistor and thereby operable to delay driving the first clock signal to the first level until a first delay time period after cessation of driving the first clock signal to the second level, the second delay circuit responsively connected to the first output transistor and thereby operable to delay driving the first clock signal to the second level until a second delay time period after cessation of driving the first clock signal to the first level, whereby a through current is prevented from flowing from the first output transistor to the second output transistor; and
    wherein the second clock generating circuit further comprises a third delay circuit connected to a third output transistor, and a fourth delay circuit connected to a fourth output transistor, the third output transistor being connected in series with the fourth output transistor at a second node which is the second output of the second clock signal generation circuit, the third delay circuit responsively connected to the fourth output transistor and thereby operable to delay driving the second clock signal to the first level until a third delay time period after cessation of driving the second clock signal to the second level, the fourth delay circuit responsively connected to the third output transistor and thereby operable to delay driving the second clock signal to the second level until a fourth delay time period after cessation of driving the second clock signal to the first level, whereby a through current is prevented from flowing from the third output transistor to the fourth output transistor.

2. The non-overlapping clock signal generator of claim 1, wherein each of the plural delay paths comprises said delay element having substantially the same delay characteristics.

3. The non-overlapping clock signal generator of claim 1, wherein each of the delay elements is selectively connected in series.

4. The non-overlapping clock signal generator of claim 1, further comprising:
   a first fuse circuit with an output to indicate a state of a first fuse, further comprising:
      a first transistor having a source/drain connected in series with said first fuse;
      a first inverter having an input connected to a node between the first fuse and the first transistor, an output of the first inverter connected to a gate of the first transistor and also to the output of the first fuse circuit; and
      a second inverter having an input connected to the output of the first fuse circuit and an output operable to provide a buffered first control signal connected to a first switching means of the plurality of switching means.

5. A non-overlapping clock signal generating circuit, comprising:
   a first clock signal generating circuit which generates a first clock signal of a first level based on a basic clock signal at the first level, and the first clock signal at a second level based on the basic clock signal at the second level and a delayed second clock signal at the first level, the first clock signal generating circuit having a first output for providing the first clock signal to an external circuit;
   a second clock signal generating circuit which generates a second clock signal at the second level based on the basic clock signal at the first level and a delayed first clock signal at the first level, and the second clock signal at the first level based on the basic clock signal at the second level, the second clock signal generating circuit having a second output for providing the second clock signal to an external circuit,
   a first clock signal delay circuit which delays the first clock signal for a prescribed time and inputs the delayed first clock signal into the second clock signal generating circuit and a second clock signal delay circuit which delays the second clock signal for a prescribed time and inputs the delayed second clock signal into the first clock signal generating circuit, such that the first clock signal and the second clock signal do not overlap, the first clock signal delay circuit and second clock signal delay circuit each include plural delay paths with different delay timing and plural switching means provided to each delay path;
   each of the plural delay paths comprising a delay element having substantially the same delay characteristics and one of the plurality of switching means, the delay time of the first clock signal and the second clock signal being set by selectively actuating one or more of the plurality of switching means to connect additional delay elements in series;
   wherein the first clock signal generating circuit further comprises a first delay circuit connected to a first output transistor, and a second delay circuit connected to a second output transistor, the first output transistor being connected in series with the second output transistor at a first node which is the first output of the first clock signal generating circuit, the first delay circuit responsively connected to the second output transistor and thereby operable to delay driving the first clock signal to the first level until a first delay time period after cessation of driving the first clock signal to the second level, the second delay circuit responsively connected to the first output transistor and thereby operable to delay driving the first clock signal to the second level until a second delay time period after cessation of driving the first clock signal to the first level, whereby a through current is prevented from flowing from the first output transistor to the second output transistor: and
   wherein the second clock generating circuit further comprises a third delay circuit connected to a third output transistor, and a fourth delay circuit connected to a fourth output transistor, the third output transistor being connected in series with the fourth output transistor at a second node which is the second output of the second clock signal generation circuit, the third delay circuit responsively connected to the fourth output transistor and thereby operable to delay driving the second clock signal to the first level until a third delay time period after cessation of driving the second clock signal to the second level, the fourth delay circuit responsively connected to the third output transistor and thereby operable to delay driving the second clock signal to the second level until a fourth delay time period after cessation of driving the second clock signal to the first level, whereby a through current is prevented from flowing from the third output transistor to the fourth output transistor; and
   wherein each of the first and second clock signal delay circuits further comprises plural control signals corresponding to the cutoff or non-cutoff of a plurality of fuses and the opening and closing of each switching means is controlled by said control signals.

6. The non-overlapping clock signal generator of claim 5, further comprising:
   a first fuse circuit with an output to indicate a state of a first fuse, further comprising:
      a first transistor having a source/drain connected in series with a first fuse of the plurality of fuses;
      a first inverter having an input connected to a node between the first fuse and the first transistor, an output of the first inverter connected to a gate of the first transistor and also to the output of the first fuse circuit; and
      a second inverter having an input connected to the output of the first fuse circuit and an output operable to provide a buffered first control signal of the plural control signals.

* * * * *